(12) United States Patent
Aksyuk et al.

(10) Patent No.: US 6,288,821 B1
(45) Date of Patent: Sep. 11, 2001

(54) HYBRID ELECTRO-OPTIC DEVICE WITH COMBINED MIRROR ARRAYS

(75) Inventors: Vladimir Anatolyevich Aksyuk, Piscataway; David John Bishop, Summit; Cristian A. Bolle, North Plainfield; John VanAtta Gates, II, New Providence; Randy Clinton Giles, Whippany; Ronald Edward Scotti, White House Station, all of NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/410,586

(22) Filed: Oct. 1, 1999

(51) Int. Cl.$^7$ ..................................................... G02F 1/03
(52) U.S. Cl. .......................... 359/245; 359/291; 359/224; 359/292; 359/223; 385/17
(58) Field of Search .................................. 359/223, 224, 359/290, 291, 292, 298, 318, 849, 851; 385/17, 18

(56) References Cited

U.S. PATENT DOCUMENTS

| | | | |
|---|---|---|---|
| 4,229,732 | 10/1980 | Hartstein et al. | 340/378.2 |
| 4,698,602 | 10/1987 | Armitage | 332/7.51 |
| 5,054,870 | 10/1991 | Lösch et al. | 385/14 |
| 5,199,087 | 3/1993 | Frazier | 385/14 |
| 5,237,434 | 8/1993 | Feldman et al. | 359/19 |
| 5,357,122 | 10/1994 | Okubora et al. | 257/84 |
| 5,416,870 | 5/1995 | Chun et al. | 385/88 |
| 5,572,540 | 11/1996 | Cheng | 372/50 |
| 5,608,826 | 3/1997 | Boord et al. | 385/37 |
| 5,611,006 | 3/1997 | Tabuchi | 385/14 |
| 5,623,564 | 4/1997 | Presby | 385/20 |
| 5,627,923 | 5/1997 | Kakizaki | 385/14 |
| 5,708,741 | 1/1998 | DeVeau | 385/49 |
| 5,719,976 | 2/1998 | Henry et al. | 385/50 |
| 5,761,350 | 6/1998 | Koh | 385/14 |
| 5,790,731 | 8/1998 | Deveau | 385/49 |
| 5,799,120 | 8/1998 | Kurata et al. | 385/45 |
| 5,828,800 | 10/1998 | Henry et al. | 385/20 |
| 5,835,256 | 11/1998 | Huibers | 359/291 |
| 5,863,809 | 1/1999 | Koren | 438/22 |
| 5,917,645 | * 6/1999 | Min et al. | 359/291 |
| 5,923,798 | 7/1999 | Aksyuk et al. | 385/19 |
| 6,097,859 | * 8/2000 | Solgaard et al. | 385/17 |
| 6,107,979 | * 8/2000 | Chiu et al. | 345/84 |

* cited by examiner

*Primary Examiner*—Scott J. Sugarman
*Assistant Examiner*—Tim Thompson

(57) ABSTRACT

An optical signal processing apparatus includes at least two mirror array chips mounted on an upper surface of a base in close proximity to each other to form a compound array. Each mirror array chip includes a substrate, and a plurality of spaced-apart mirrors mounted on an upper surface of the substrate. The mirrors are movable in response to an electrical signal. A plurality of electrical leads for conduct the electrical signals to the mirrors, at least a portion of the electrical leads extending at least partially along the upper surface of the base between a lower surface of the substrate and the upper surface of the base.

18 Claims, 4 Drawing Sheets

HYBRID ELECTRO-OPTIC DEVICE WITH COMBINED MIRROR ARRAYS

BACKGROUND OF THE INVENTION

1. Field of the Invention

The present invention relates to optical signal processing apparatus and more particularly to an optical apparatus having a mirror array.

2. Background of the Related Art

Electro-optic devices often employ an array of micromachined mirrors, each mirror being individually movable in response to an electrical signal. For example, the mirrors can each be cantilevered and moved by an electrostatic force. Typically, electro-optic mirror array devices can be used as optical cross connects in optical communication systems, visual presentations and displays, for example. Generally, each mirror of the cross connect is addressed by a number of electrical lead lines and receives a beam of light from, for example, an individual optical fiber in a fiber optic bundle. The beams reflected from the mirrors are individually directed to a prespecified location (for example, another fiber optic bundle) by individually moving the mirrors.

It is desirable to have a high density of optical transfer. However, large mirror arrays are generally not feasible because the electrical interconnection density often presents a bottleneck. As the number of mirrors in an array increases, the number of electrical lead lines also increases, and these lead lines must be crowded into more confined spaces. For example, a 256 mirror array chip (16×16 array) with four lead lines per mirror requires 1,032 wirebond pads and electrical interconnections. The electrical leads must be adequately spaced to handle relatively high voltage (e.g., 100–150 volts). Hence there is a limit as to how small the leads can be made and how closely they can be spaced apart from each other. The routing of this number of electrical wires between the individual mirror elements, and routing from the chip center to the outer edge, forces the mirror spacing to be larger than desired and limits the useful size of the integrated array.

What is needed is an electro-optic chip which includes a larger array of mirrors while not increasing the mirror spacing.

SUMMARY

An optical signal processing apparatus is provided herein which comprises: a base, and at least two mirror array chips mounted on an upper surface of the base in close proximity to each other to form a compound array. Each mirror array chip includes a substrate and a plurality of spaced-apart mirrors mounted on an upper surface of the substrate. The mirrors are movable in response to an electrical signal. The mirror array chip further includes a plurality of electrical leads for conducting the electrical signal to the mirrors. At least a portion of the electrical leads extend at least partially along the upper surface of the base between a lower surface of the substrate and the upper surface of the base.

BRIEF DESCRIPTION OF THE DRAWINGS

Various embodiments of the invention are described below with reference to the drawings wherein.

DETAILED DESCRIPTION OF PREFERRED EMBODIMENTS

Figure 1:
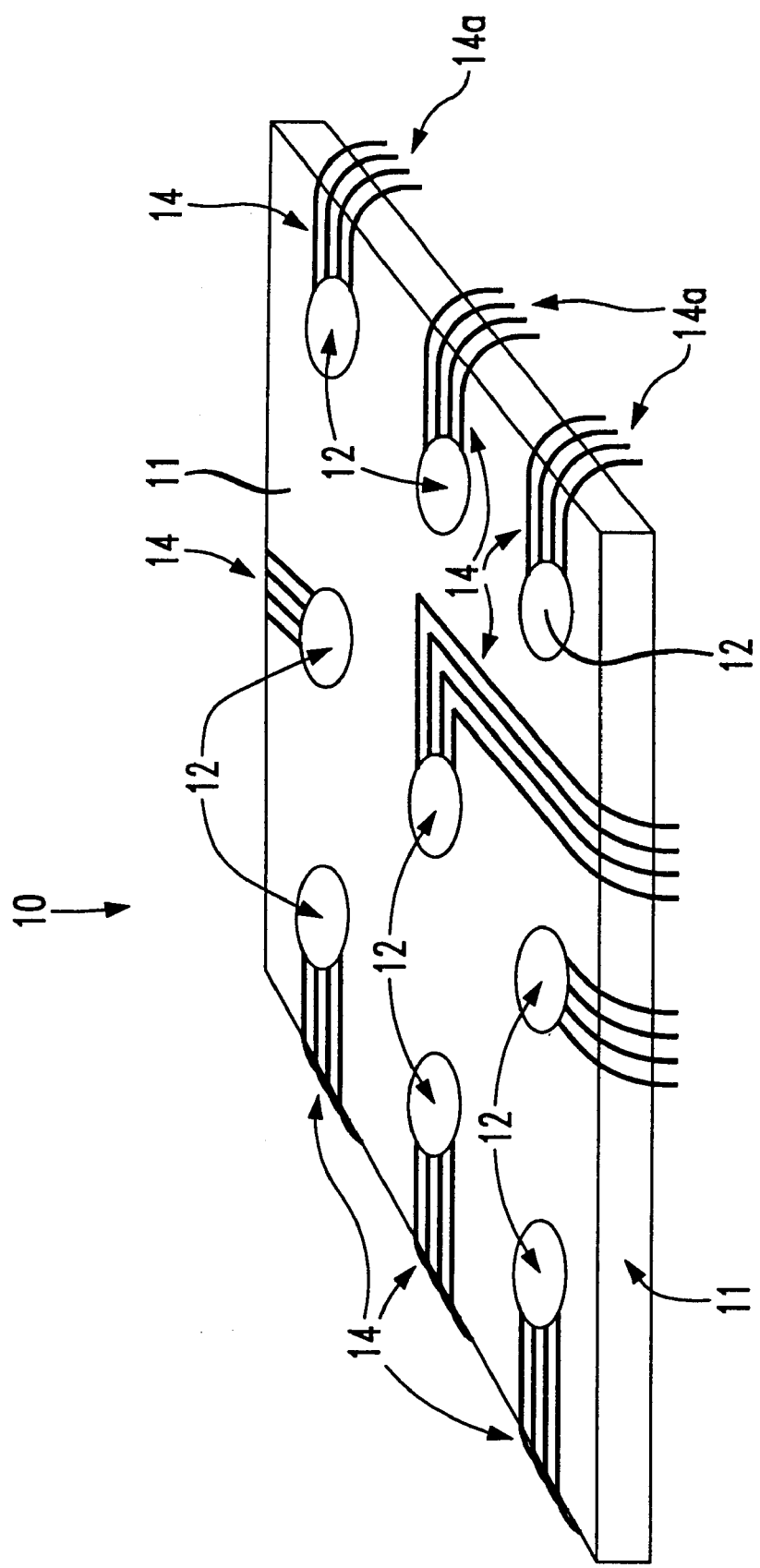
FIG. 1 is a perspective view of a mirror array chip.

Referring now to FIG. 1, a mirror array chip 10 is shown which includes a substrate 11, a plurality of mirrors 12 positioned on the substrate 11, and a plurality of electrical lead lines 14 extending from each mirror 12 to connection points 14a beyond the periphery of the substrate 11. The substrate 11 can be, for example, a silicon wafer. Such mirror array chips are known to those with skill in the art. The mirrors 12 are typically fabricated by micro-machining and are movable from one angular orientation to another in response to the application thereto of an electrostatic force. Electrical leads (at least two, and preferably four per mirror) carry the electrical charge to the mirror. By individually regulating the charges on the electrical lead lines 14 the position of the mirrors can be individually adjusted as desired. The mirrors 12 can be of any appropriate shape (e.g., circular, square, rectangular, and the like), and can be of any suitable size, but typically range in diameter from about 100 to 1,000 µm, preferably 200 to 800 µm, and more preferably 400 to 600 µm. The center to center spacing of the mirrors 12 can be any dimension greater than one mirror diameter, but typically ranges from 1.5 mirror diameters to about 3 mirror diameters, preferably from 1.75 mirror diameters to about 2.25 mirror diameters. The spacing between the edge of one mirror and the edge of its closest neighboring mirror can range from about 100 to 1,000 µm, preferably 200 to 800 µm, and more preferably 400 to 600 µm.

Typically, the mirror array chip 10 can be used, for example, in optical cross connect applications in which light beams from a bundle of optical fibers are individually directed onto each mirror 12. The mirrors 12 are individually adjustable to deflect the light beams to predetermined optical receivers, such as another bundle of optical fibers.

Mirror array chip 10 shown in FIG. 1 is a 3×3 mirror array containing 9 mirrors, of which 8 mirrors are peripheral and 1 mirror is interior. As can readily be appreciated, the electrical lead lines of the interior mirror must extend through the space between two other mirrors. However, as the number of mirrors in an array is increased, the number of interior mirrors dramatically increases. For a 16×16 mirror array chip containing 256 mirrors there are 60 peripheral mirrors and 196 interior mirrors. As explained above, the lead lines to the 196 interior mirrors must be routed through the spaces between mirrors. Since the wires carry a relatively high electrostatic voltage (e.g., typically 100–150 volts) there must be adequate spacing between the lead lines 14. The practical limiting size of the mirror array chip is 16×16, i.e., a 256 mirror array. Typically, the length of each side of a 256 mirror array chip of square shape with 500 µm diameter mirrors is about 2 cm. To increase the size of the array would require increased spacing between mirrors, which undesirably decreases the mirror density of the array. The invention described herein increases the capacity of the optical cross connect to accommodate fiber optic bundles with over 1,000 optical fibers yet still retaining a high mirror density.

Figure 2:
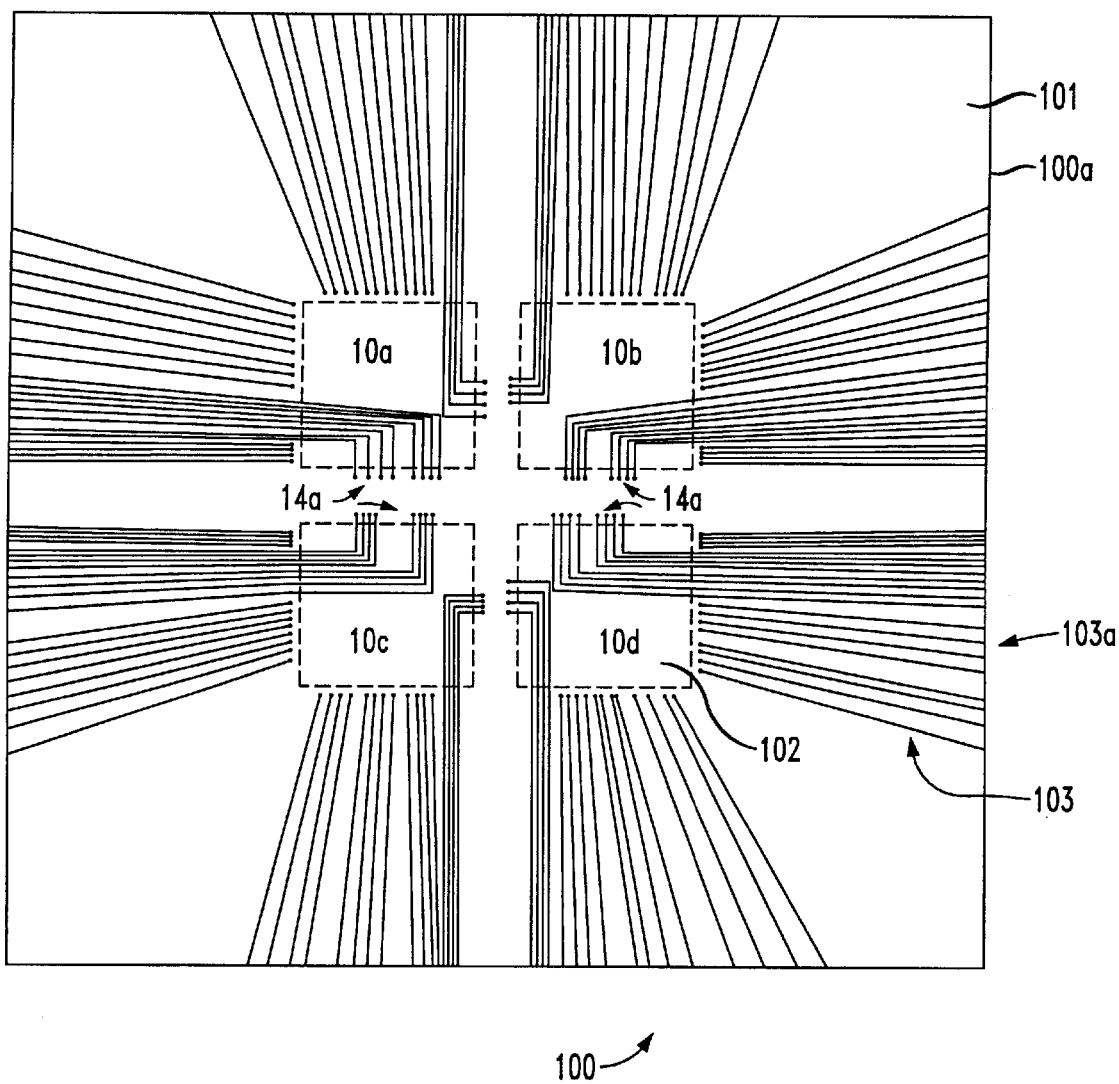
FIG. 2 is a plan view of the base upon which the mirror array chips are mounted.

Referring to FIG. 2, four mirror array chips 10 are positioned in respective spaces 10a, 10b, 10c, and 10d, on a support 100, which includes a base 101, and a plurality of secondary leads 103 each corresponding to a respective lead line 14 and forming a continuous electrical connection. Base 101 can be silicon, high density multilayered thin film sheet, ceramic, or standard circuit boards. Typically, the support 100 has an edge length or a diameter of several inches. The secondary leads 103 extend from the connection points 14*a* towards connection points 103*a* the periphery 100*a* of support 100. Manufacturing techniques for fabricating a support and for affixing a mirror array chip thereto are known in the art.

As can be seen, secondary leads 103 fan outward as they approach the periphery 100*a* so that the spacing between the secondary leads 103 is greater near periphery 100*a* than at the edges of the mirror array chips 10. The greater spacing between the secondary lead lines near periphery 100*a* facilitates the use of wirebonding and soldering as methods for electrically connecting the secondary leads 103 to other electrical components. Soldering, for example, requires a spacing of about 200 $\mu$m between lead lines, which cannot be readily achieved on the mirror array chip 10 itself.

A significant feature of the present invention is that at least a portion of the secondary lead lines 103 traverse the spaces 10*a*, 10*b*, 10*c*, and 10*d*, onto which the respective mirror array chips 10 are positioned. Thus, the secondary lead lines 103 extend beneath the mirror array chips 10 and between the bottom surface of the respective mirror array chip and the top surface of the base 101, thereby exploiting an additional area of space. Use of this additional area beneath the mirror array chips 10 enables at least two, and preferably four mirror array chips 10 to be positioned in close proximity, thereby forming a compound array of greater capacity.

Figure 3:
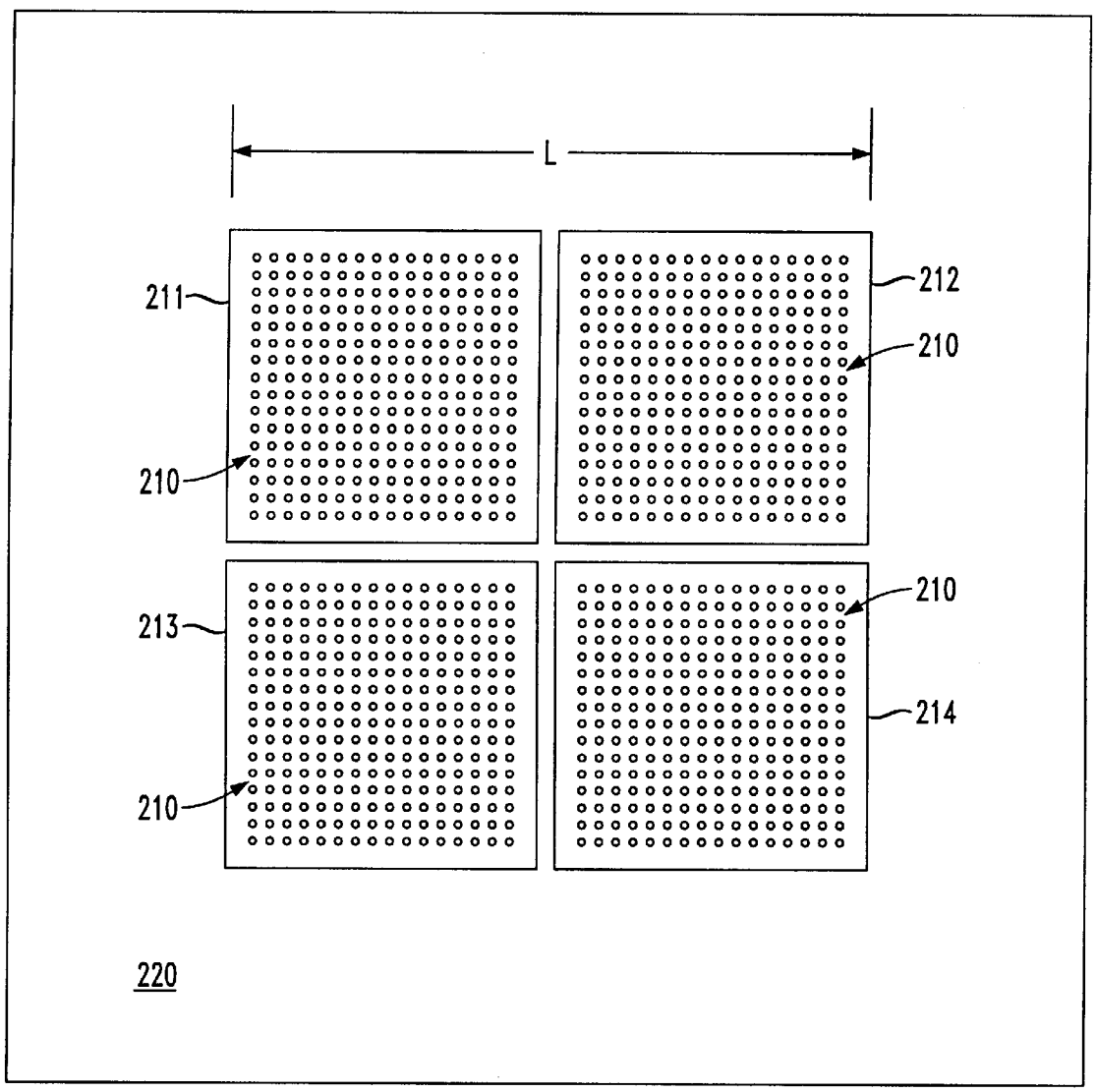
FIG. 3 is a diagrammatic plan view of the optical signal processing apparatus including four 16×16 mirror array chips.

Referring to FIG. 3, a compound, square multichip array 200 is illustrated which includes 1024 mirror elements 210 in four separate 16×16 mirror array chips 211, 212, 213, 214 and more than 4,000 wirebond pads and electrical connections (not shown), positioned on a base 220. Length L is no more than about 4 cm. Multichip array 200 therefore has a 1,024 mirror capacity at a density of about 64 mirrors per square cm.

Figure 4:
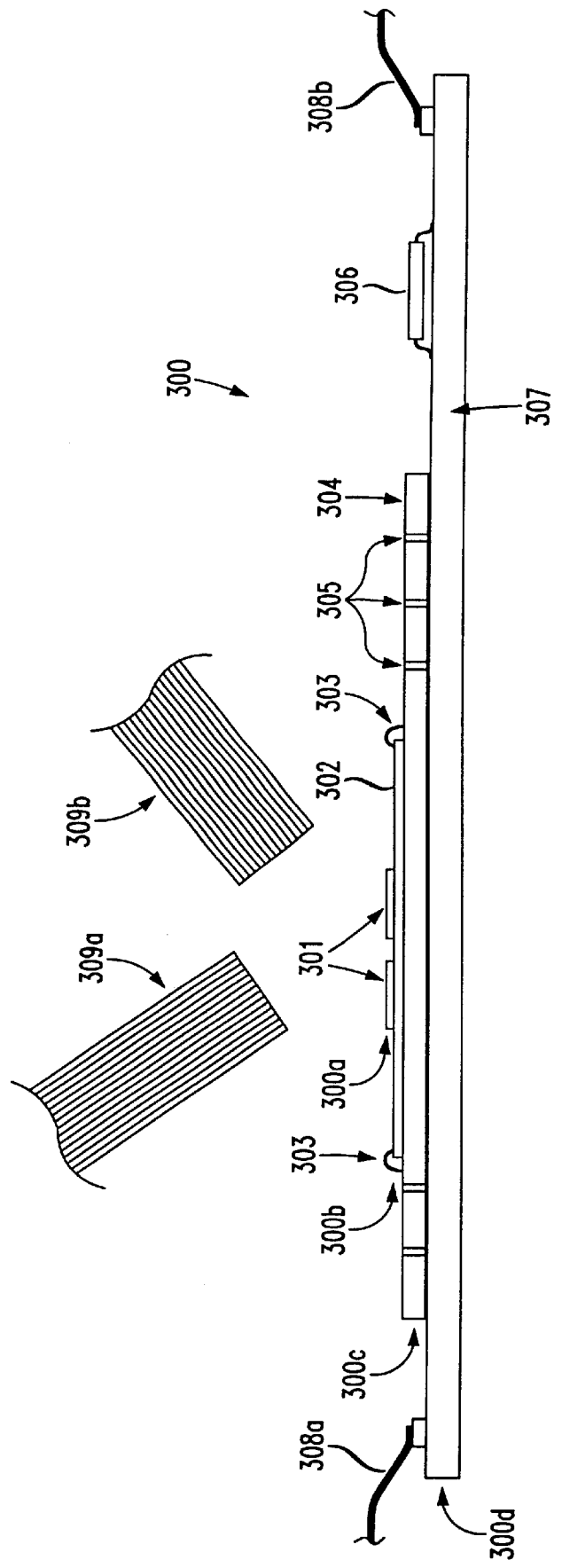
FIG. 4 is an elevational side view of a hybrid electro-optic assembly.

Referring now to FIG. 4, a hybrid, multi-layered electro-optic structure 300 is shown which includes a plurality of mirror array chips 301 defining a first layer 300*a* positioned on a base 302 defining a second layer 300*b*, the mirror array chips 301 being electrically connected thereto to form a compound, multichip array. A plurality of wirebonds 303 electrically connect the electrical leads of the base 302 to a wafer 304 defining a third layer 300*c* supporting an integrated signal processing circuit. Optional vias 305 electrically connect the integrated circuit of wafer 304 to a printed circuit on board 307 defining a fourth layer 300*d*. Discrete passive and/or active electronic components 306 may optionally be incorporated into the circuit on board 307. Such components can include, for example, transistors, rectifiers, capacitors, inductors, batteries, and the like. Cable connectors 308*a* and 308*b* provide electrical power and/or electrical signals to the structure 300 from a source (not shown). The electrical circuits on wafer 304 and board 307 direct electrical signals to the individual mirrors and may included decoding functions. The layers of the structure 300 can be individually fabricated from single or double sided silicon wafers, flex tape, multi-layered ceramics, and multi-layered circuit boards.

A bundle of optical fibers 309*a* transmits light to the mirror array chips 301, each optical fiber individually directing a beam of light to a respective one of the mirrors in the mirror array chips 301. The mirrors are controlled by electronic signals to individually direct the light beams to a respective one of the optical fibers of bundle 309*b*. Over 1,000 fibers can be in each bundle. The light beams can be used, for example, in visual displays, or as carriers of digital information in telecommunication networks.

While the above description contains many specifics, these specifics should not be construed as limitations of the invention, but as exemplifications of preferred embodiments thereof. Those skilled in the art will envision other variations within the scope and spirit of the invention as defined by the claims appended hereto.

What is claimed is:

1. An optical signal processing apparatus which comprises:

a) a base; and, b) at least two mirror array chips mounted on an upper surface of the base in close proximity to each other to form a compound array, each mirror array chip including a silicon substrate, and a plurality of spaced-apart mirrors mounted on an upper surface of the silicon substrate, the mirrors being movable in response to an electrical signal, and a plurality of electrical leads for conducting the electrical signal to the mirrors, at least a portion of the electrical leads extending at least partially along the upper surface of the base between a lower surface of the silicon substrate and the upper surface of the base.

2. The apparatus of claim 1 wherein the compound array includes at least 1,000 mirrors.

3. An optical signal processing apparatus which comprises:

a) a base; and, b) at least two mirror array chips mounted on an upper surface of the base in close proximity to each other to form a compound array, each mirror array chip including a substrate, and a plurality of spaced-apart mirrors mounted on an upper surface of the substrate, the mirrors each being individually movable in response to an electrical signal, and a plurality of electrical leads for conducting the electrical signal to the mirrors, at least a portion of the electrical leads extending at least partially along the upper surface of the base between a lower surface of the substrate and the upper surface of the base, wherein four mirror array chips are mounted to the upper surface of the base.

4. The apparatus of claim 3 wherein each mirror array chip includes up to 256 mirrors.

5. The apparatus of claim 1 wherein the apparatus includes at least two lead wires for each mirror.

6. An optical signal processing apparatus which comprises:

a) a base; and, b) at least two mirror array chips mounted on an upper surface of the base in close proximity to each other to form a compound array, each mirror array chip including a substrate, and a plurality of spaced-apart mirrors mounted on an upper surface of the substrate, the mirrors being movable in response to an electrical signal, and a plurality of electrical leads for conducting the electrical signal to the mirrors, at least a portion of the electrical leads extending at least partially along the upper surface of the base between a lower surface of the substrate and the upper surface of the base, wherein the apparatus includes at least four lead wires for each mirror.

7. The apparatus of claim 6 wherein the lead wires extend to a peripheral edge of the base and fan outward so as to be more spaced apart from each other in the vicinity of the base than in the vicinity of the mirror array chips.

8. The apparatus of claim 1 wherein the mirrors range in diameter from about 100 µm to about 1,000 µm.

9. The apparatus of claim 1 wherein the mirrors are spaced apart from each other a distance of from about 100 µm to about 1,000 µm.

10. An optical signal processing apparatus which comprises:
   a) a base; and,
   b) at least two mirror array chips mounted on an upper surface of the base in close proximity to each other to form a compound array, each mirror array chip including a substrate, and a plurality of spaced-apart mirrors mounted on an upper surface of the substrate, the mirrors each being individually movable in response to an electrical signal, and a plurality of electrical leads for conducting the electrical signal to the mirrors, at least a portion of the electrical leads extending at least partially along the upper surface of the base between a lower surface of the substrate and the upper surface of the base,
   wherein the lead wires are sufficiently sized and spaced to carry a voltage of up to about 150 volts.

11. The apparatus of claim 1 wherein the base is fabricated from silicon.

12. An electro-optic signal processing assembly which comprises:
   a) an optical signal processing apparatus which includes
      i) a base, and
      ii) at least two mirror array chips mounted on an upper surface of the base in close proximity to each other to form a compound array, each mirror array chip including a substrate, and a plurality of spaced-apart mirrors mounted on an upper surface of the substrate, the mirrors being movable in response to respectively directed electrical signals, and a plurality of electrical leads for conducting the electrical signals to the respective mirrors, at least a portion of the electrical leads extending at least partially along the upper surface of the base between a lower surface of the substrate and the upper surface of the base;
   b) a plurality of optical fibers for individually conveying light beams to respective mirrors of the mirror array chips;
   c) a plurality of receptors for individually receiving light beams reflected by respective mirrors of the mirror array chips; and
   d) at least one electrical circuit for processing electrical signals to be conducted by the electrical leads to the respective mirrors,
   wherein the optical signal processing apparatus includes at least four electrical leads for each mirror.

13. The assembly of claim 12 wherein the plurality of receptors for individually receiving light beams comprises a second plurality of optical fibers.

14. The assembly of claim 12 wherein the compound array includes at least 1,000 mirrors.

15. The assembly of claim 14 wherein the compound array includes four mirror array chips, each mirror array chip possessing 256 mirrors.

16. The assembly of claim 12 wherein the at least two mirror array chips define a first layer, the base defines a second layer, and the assembly further includes a wafer having a surface to which the base is affixed, the wafer defining a third layer and including at least a portion of the electrical circuit for processing electrical signals.

17. The assembly of claim 16 further including a fourth layer to which the wafer is affixed, the fourth layer including at least a portion of the electrical circuit for processing electrical signals.

18. The assembly of claim 17 wherein the base and the wafer are fabricated from silicon.

\* \* \* \* \*